United States Patent
Lee et al.

(10) Patent No.: US 10,304,681 B2
(45) Date of Patent: May 28, 2019

(54) DUAL HEIGHT GLASS FOR FINFET DOPING

(71) Applicant: Intel Corporation, Santa Clara, CA (US)

(72) Inventors: Chen-Guan Lee, Portland, OR (US); Lu Yang, Hillsboro, OR (US); Joodong Park, Portland, OR (US); Chia-Hong Jan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/573,458

(22) PCT Filed: Jun. 22, 2015

(86) PCT No.: PCT/US2015/037003
§ 371 (c)(1),
(2) Date: Nov. 10, 2017

(87) PCT Pub. No.: WO2016/209206
PCT Pub. Date: Dec. 29, 2016

(65) Prior Publication Data
US 2018/0114695 A1    Apr. 26, 2018

(51) Int. Cl.
*H01L 29/78*  (2006.01)
*H01L 21/225* (2006.01)
(Continued)

(52) U.S. Cl.
CPC ...... *H01L 21/2255* (2013.01); *H01L 27/0886* (2013.01); *H01L 29/0638* (2013.01);
(Continued)

(58) Field of Classification Search
CPC ....... H01L 21/336; H01L 21/28; H01L 29/78; H01L 21/8238; H01L 29/76; H01L 27/12;
(Continued)

(56) References Cited

U.S. PATENT DOCUMENTS

| | | |
|---|---|---|
| 9,059,043 B1 | 6/2015 | Leobandung et al. |
| 2004/0159895 A1 | 8/2004 | Abbott et al. |

(Continued)

FOREIGN PATENT DOCUMENTS

| | | |
|---|---|---|
| CN | 104716171 | 6/2015 |
| WO | WO 2015047253 | 4/2015 |

OTHER PUBLICATIONS

International Search Report and Written Opinion for International Patent Application No. PCT/US2015/037003 dated Feb. 29, 2016, 11 pgs.

(Continued)

*Primary Examiner* — Selim U Ahmed
(74) *Attorney, Agent, or Firm* — Schwabe, Williamson & Wyatt, P.C.

(57) ABSTRACT

Dual height glass is described for doping a fin of a field effect transistor structure in an integrated circuit. In one example, a method includes applying a glass layer over a fin of a FinFET structure, the fin having a source/drain region and a gate region, applying a polysilicon layer over the gate region, removing a portion of the glass layer from the source/drain region after applying the polysilicon, and thermally annealing the glass to drive dopants into the fin, and applying an epitaxial layer over the source/drain region.

9 Claims, 4 Drawing Sheets

(51) Int. Cl.
*H01L 29/66* (2006.01)
*H01L 27/088* (2006.01)
*H01L 29/06* (2006.01)

(52) U.S. Cl.
CPC .. *H01L 29/66545* (2013.01); *H01L 29/66803* (2013.01); *H01L 29/785* (2013.01)

(58) Field of Classification Search
CPC ........... H01L 21/2255; H01L 29/66545; H01L 29/0638; H01L 27/0886; H01L 29/66803; H01L 29/785
See application file for complete search history.

(56) References Cited

U.S. PATENT DOCUMENTS

| | | |
|---|---|---|
| 2009/0035909 A1 | 2/2009 | Chang et al. |
| 2011/0133292 A1 | 6/2011 | Lee |
| 2012/0098056 A1 | 4/2012 | Blanchard et al. |
| 2013/0126972 A1 | 5/2013 | Wang et al. |
| 2013/0175625 A1 | 7/2013 | Cheng et al. |
| 2013/0280883 A1 | 10/2013 | Faul et al. |
| 2014/0117462 A1 | 5/2014 | Cheng et al. |
| 2014/0252488 A1 | 9/2014 | Fu-Ching-Feng et al. |
| 2015/0162438 A1 | 6/2015 | Chou |
| 2017/0018658 A1* | 1/2017 | Hafez .................. H01L 29/404 |

OTHER PUBLICATIONS

Search Report from European Patent Application No. 15896500.4, dated Jan. 25, 2019, 9 pgs.

\* cited by examiner

SOURCE OR DRAIN REGION

GATE REGION

US 10,304,681 B2

DUAL HEIGHT GLASS FOR FINFET DOPING

CROSS-REFERENCE TO RELATED APPLICATION

This patent application is a U.S. National Phase Application under 35 U.S.C. § 371 of International Application No. PCT/US2015/037003, filed Jun. 22, 2015, entitled "DUAL HEIGHT GLASS FOR FINFET DOPING," which designates the United States of America, the entire disclosure of which is hereby incorporated by reference in its entirety and for all purposes.

FIELD

The present description relates to semiconductor transistor formation and, in particular, to doped glass.

BACKGROUND

FinFET (Fin Field Effect Transistor) technology builds fins across the top of a silicon substrate. Rather than forming transistors on the surface of the silicon substrate (planar FET), FinFET transistors are formed on the fins. The surface of the substrate is still available to be used for other structures which increase the total number of devices. In addition the effective channel width of a FinFET is larger than for a planar FET.

Any silicon semiconductor transistor, whether of the fin type or planar type, experiences current leaking from the current source (S) to the drain (D) terminals. In order to reduce the leakage in fin FET, the substrate is doped beside and underneath the fin. This doping is done by applying thermal diffusion. This drives the dopant beside and beneath the fin but not on and over the fin.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

As described herein a dual-height recessed glass may be used when doping around a fin. The glass in the source and drain region of a FinFET transistor is recessed further than the glass in the channel region. The glass is then annealed. After thermal annealing, the doping below a fin is further away from the source and drain epitaxial layers. This provides less current leakage from the sharp epitaxial/glass junction.

A highly doped glass is deposited over the fin as the dopant source. A solid boron or phosphorous type glass is often used. The glass then receives a thermal annealing to drive the dopants in the glass into the fin to dope the fin. By recessing the glass before the annealing, the fin top can be dopant free while the fin bottom is doped for isolation.

To improve the gate control and reduce source, drain, and substrate leakage components, opposite dopants may be used in the sub-fin doping as compared to the epitaxial contact doping.

As an example, the epitaxial layer in a PMOS (p-type MOS) transistor may be heavily doped with a boron dopant and the sub-fin area may be doped with a phosphorous type dopant. As a result, when the bottom of the epitaxial layer is close to the sub-fin doping region, a sharp PN junction is formed and causes high junction leakage current. This current junction leakage is more prominent in high voltage applications. To reduce junction leakage, the junction may be graded by separating the two doping regions farther away from each other. Using a dual height recessed glass structure, the epitaxial and sub-fin doping regions can be separated further to reduce junction leakage while keeping the volume of the epitaxial layer unchanged, which maintains the strain and transistor performance.

The recessed glass technology described herein may also be used for diodes. In a diode with epitaxial and sub-fin doping there is an abrupt junction. When a high reverse bias is applied to a diode there can be a high diode junction leakage current. A dual-height recessed glass structure can be used to further separate the epitaxial layer from the glass doping. This reduces the leakage current at the junction.

Figure 1:
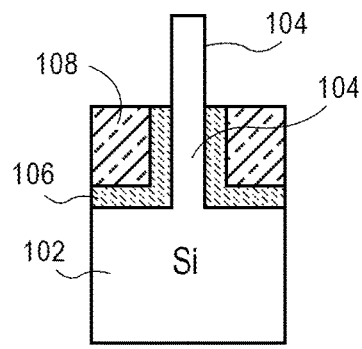
FIG. 1 is cross-sectional side view diagram of a fin of a FinFET structure taken through a source or drain region in first stage of processing according to an embodiment.

FIG. 1 is a cross-sectional side view diagram of a fin of a FinFET structure taken through either a source or a drain region. The diagram shows the fin at an initial stage of a doping process. A fin 104 has been formed over a silicon substrate 102. The FinFET transistor is built around a thin strip of semiconductor material 104. The transistor to be formed includes the standard field effect transistor (FET) nodes, including a gate, a gate isolation dielectric, and source and drain regions. The conductive channel of the device resides within the fin above the gate isolation dielectric.

Current runs along both sidewalls of the fin (sidewalls perpendicular to the substrate surface) as well as along the top of the fin (side parallel to the substrate surface). Because the conductive channel of such configurations essentially resides along the three different outer planar regions of the fin, such a FinFET design is sometimes referred to as a tri-gate FinFET. The techniques herein may also be applied to other types of FinFET transistors, including double-gate FinFETs, in which the conductive channel principally resides along the two sidewalls of the fin structure. While embodiments are described in the context of silicon processes in a silicon substrate, the techniques and structures described herein may be adapted to doping in other materials.

The formation of the fins and isolation dielectric can be carried out in a number of ways. Any number of suitable substrates can be used here, including bulk substrates, semiconductors on insulator substrates (XOI, where X is a semiconductor material such as Si, Ge or Ge-enriched Si), and multi-layered structures, including those substrates upon which fins are formed prior to a subsequent gate patterning process. The substrate may be formed using alternate materials, which may or may not be combined with silicon, that include but are not limited to germanium, indium antimonide, lead telluride, indium arsenide, indium phosphide, gallium arsenide, or gallium antimonide. Further materials classified as group III-V or group IV materials may also be used to form the substrate.

The fan 104 and substrate 102 have been covered in a glass layer 106. The glass layer 106 has been covered with an isolation layer 108. The trenches between each fin may be completely covered with the glass and then subsequently filled with an isolation dielectric material, using any number of standard deposition processes. In some embodiment having a silicon substrate, the isolation dielectric material is silicon dioxide, but any other suitable isolation dielectric materials may be used to form the layer. The isolation area may operate as shallow trench isolation (STI).

The glass layer may be a boron or a phosphorous glass. Alternatively, the glass may be doped with another material such as, aluminum, antimony, or arsenic. The glass layer is applied using chemical vapor deposition or spin-on approaches. In some embodiments, a boron doped glass is used in the source and drain regions of FIG. 1, while a phosphorous doped glass is used in the gate region of FIG. 2. The particular dopant and types of glass and how the glass is applied may be adapted to suit different implementations. The isolation layer may be formed of a suitable oxide such as silicon oxide or silicon nitride which may be applied by chemical vapor deposition or with furnace tools. After the glass and isolation are applied they are removed from the top of the fin with a controlled etch process. Since this etch is before the polysilicon is applied, a simple recess etch in a plasma etch chamber will expose the tops of the fins.

Figure 2:
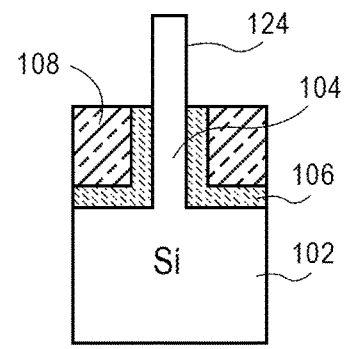
FIG. 2 is cross-sectional side view diagram of a fin of a FinFET structure taken through a gate region in first stage of processing according to an embodiment.

FIG. 2 is a cross-sectional side view diagram of the same fin taken through a gate region. FIG. 2 is at the same initial stage for the doping as shown in the example of FIG. 1. As in FIG. 1, the fin 104 is formed on the same substrate 102. The fin is covered in the same glass 106 and isolation layer 108. The layers are also recessed to expose the top 124 of the fin 104. The gate region of the fin is processed in the same way at the same time as the source and drain regions. As shown, the glass and isolation layer cover the fin to the same height across the whole fin including the gate, source, and drain regions. As a result, an anneal process applied to the glass in this condition will result in a uniform level of doping profile across the whole fin. This uniform level will be changed as shown in FIGS. 5 and 6.

Figure 3:
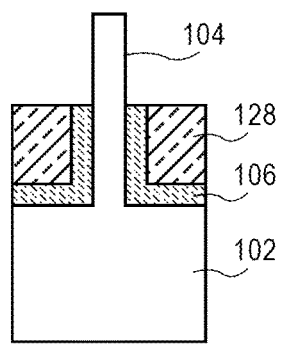
FIG. 3 is cross-sectional side view diagram of a fin of a FinFET structure taken through a source or drain region in second stage of processing according to an embodiment.
Figure 4:
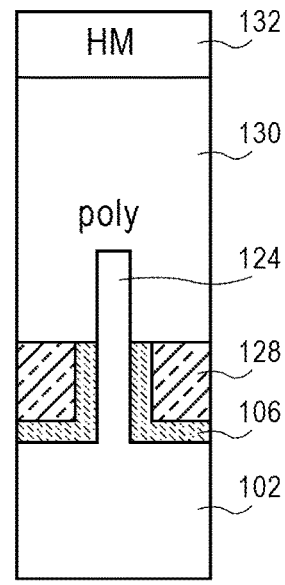
FIG. 4 is cross-sectional side view diagram of a fin of a FinFET structure taken through a gate region in second state of processing according to an embodiment.

FIGS. 3 and 4 are cross-sectional side view diagrams to show the source and gate regions as in FIGS. 1 and 2, respectively, at a second stage in the doping process. In this case the source or drain region shown in FIG. 3 is unchanged from FIG. 1. In FIGS. 3 and 4 a polysilicon layer is applied over the fin and over the glass and isolation layer and an HM (Hard Mask) is applied over the polysilicon. After photolithography patterning and etch, the polysilicon and HM in the source and drain region are removed, as shown in FIG. 2. In some embodiments, a photoresist layer is applied over the entire fin and other structures on the substrate 102. The photoresist is patterned by exposure and development to expose only the gate areas. The polysilicon and HM layer are applied over the entire surface and then the photoresist and excess materials are removed by etching.

Figure 5:
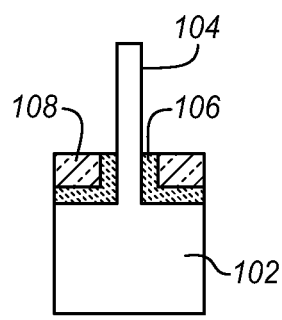
FIG. 5 is cross-sectional side view diagram of a fin of a FinFET structure taken through a source or drain region in third stage of processing according to an embodiment.
Figure 6:
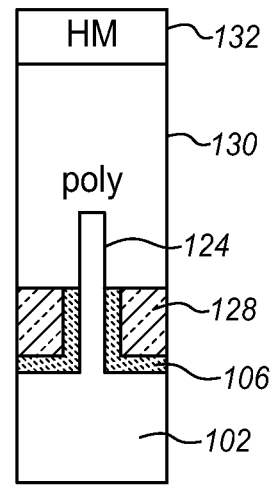
FIG. 6 is cross-sectional side view diagram of a fin of a FinFET structure taken through a gate region in third stage of processing according to an embodiment.

FIGS. 5 and 6 are cross-sectional side view diagrams to show the source and gate regions as in FIGS. 1 and 2 in a third stage of the doping process. In FIG. 6, the polysilicon and HM remain over the gate region of the fin. These layers serve as a protection for the glass 106 and isolation layers 108 of the gate region. The gate region of the fins is masked by the polysilicon and HM. The source and drain regions of FIG. 5 are not similarly protected by the polysilicon and HM mask. An etch, such as a radio frequency plasma etch, is applied to the entire device. The unmasked areas are exposed to the plasma that removes a part of the glass and isolation in the source and drain regions without affecting the protected masked gate areas of FIG. 6. As shown in FIG. 5 about half of the glass and isolation has been removed leaving only about one quarter of the fin covered. Such a recess provides good results in many situations but the drawing is not provided to show precise dimensions and scale.

This etching process creates a recess in the glass for the source and drain regions. In other words, the glass height in the source and drain regions is lower than the glass height in the gate regions. This difference in height, or glass height delta, causes a difference in the doping profile. The height referred to here for the glass refers to the height on the fin 104, 124 as measured from the base of the fin or from the substrate 102. The height may be considered to be the distance from the substrate above which the fin has been formed. After the dual height recessed glass is formed as in FIGS. 5 and 6, the entire substrate and fin structure is annealed. This may be done in a reaction chamber by heating the chamber to a temperature high enough to diffuse dopants from the glass to the fin. The annealing drives the dopants, such as boron and phosphorous into the fin. This creates the doped regions for the transistor structure.

Figure 7:
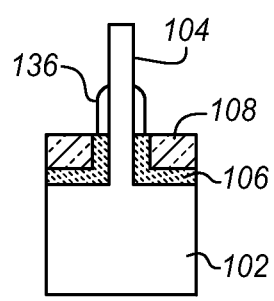
FIG. 7 is cross-sectional side view diagram of a fin of a FinFET structure taken through a source or drain region in fourth stage of processing according to an embodiment.
Figure 8:
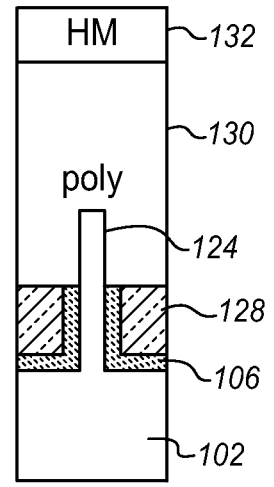
FIG. 8 is cross-sectional side view diagram of a fin of a FinFET structure taken through a gate region in fourth stage of processing according to an embodiment.

FIGS. 7 and 8 are cross-sectional side view diagrams to show the source and gate regions as in FIGS. 1 and 2 in a fourth stage of the doping process. In FIG. 7 a spacer 136 is formed on the polysilicon sidewall. The gate regions are protected from the spacer material by the existing polysilicon as shown in FIG. 8. The spacer may be formed of a variety of different materials, such as silicon nitride, silicon oxynitride, and silicon carbide, among others. The spacer is applied over the entire fin by deposition and then removed from the top of the fin by a plasma etch. The etch rate and the selectivity of the etching may be adjusted so that only the desired amount of spacer remains at the base of the fin as shown in FIG. 7.

Figure 9:
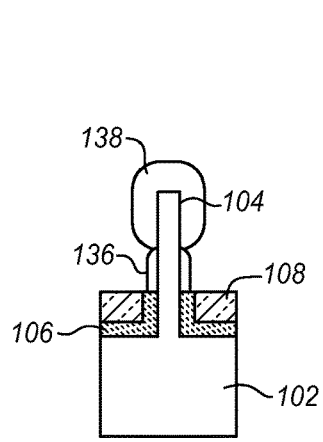
FIG. 9 is cross-sectional side view diagram of a fin of a FinFET structure taken through a source or drain region in fifth stage of processing according to an embodiment.
Figure 10:
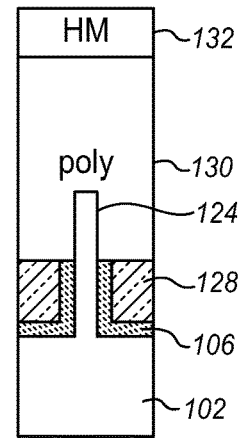
FIG. 10 is cross-sectional side view diagram of a fin of a FinFET structure taken through a gate region in fifth stage of processing according to an embodiment.

FIGS. 9 and 10 are cross-sectional side view diagrams to show the source and gate regions as in FIGS. 1 and 2 in a fifth stage of the doping process. In FIG. 9, the fin is undercut with dry etch and an epitaxial layer 138 is grown over the source and drain regions. An epitaxial deposition process may be carried out to cover the fin with a silicon alloy such as silicon germanium or silicon carbide, thereby forming the source and drain regions. In some implementations, the epitaxially deposited silicon alloy may be doped in situ with dopants such as boron, arsenic, or phosphorous. In further implementations, alternate materials may be deposited into the recesses to form the source and drain regions, such as germanium or a group III-V material or alloy. The fin spacer 136 separates this epitaxial layer 138 from the glass dopants 106 on the other side of the spacer. This separation results in a gradual transition in the PN junction between the epitaxial and the glass dopants in the source and drain region, while the glass dopant level in the gate remains unchanged. As a result, the glass dopant level in the gate is able to sustain the leakage current in between the source and the drain, while keeping the junction leakage current low in the source and drain regions. The gate of FIG. 10 is unchanged in FIGS. 4, 6, 8, and 10.

Figure 11:
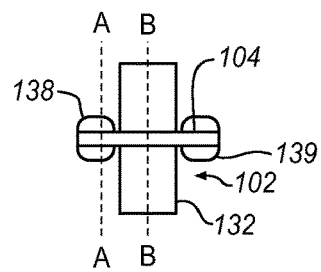
FIG. 11 is a top plan view of the structure of FIGS. 9 and 10 showing the cross sections according to an embodiment.

FIG. 11 is a top plan view of the structure of FIGS. 9 and 10 together showing the fin 104 on the substrate 102. The HM 132 is shown over the gate and the epitaxial layer 138 is shown over a source part of the fin. A similar epitaxial layer 139 is shown over a drain region. Line A-A shows the cross-section used for FIGS. 1, 3, 5, 7, and 9. Line B-B shows the cross-section used for FIGS. 2, 4, 6, 8, and 10.

After the fifth stage as shown in FIGS. 9 and 10, the gate dielectric is formed using a gate replacement approach. The illustrated gate materials are sacrificial materials that are later removed for a replacement metal gate (WAG-Wrap Around Gate) process. The polysilicon material is a dummy material which is removed together with the HM. The empty areas are then filled with dielectric and gate materials which may be selected from any of a variety of different materials. The gate isolation dielectric can be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. In general, the thickness of the gate isolation dielectric should be sufficient to electrically isolate the gate electrode from the neighboring source and drain contact.

In some embodiments, additional processing may be performed on the high-k gate dielectric layer, such as an annealing process to improve the quality of the high-k material. The HM or gate material may alternatively be, for example, polysilicon, silicon nitride, silicon carbide, or a metal layer (e.g., tungsten, titanium nitride, tantalum, tantalum nitride) although other suitable gate electrode materials can be used as well. Each of the gate isolation dielectric and gate materials may be deposited using, for example, conventional deposition processes such as chemical vapor deposition (CVD), atomic layer deposition (ALD), spin-on deposition (SOD), or physical vapor deposition (PVD). Alternate deposition techniques may be used as well, for instance, the gate isolation dielectric and gate materials may be thermally grown. As will be appreciated in light of this disclosure, any number of other suitable materials, geometries, and formation processes can be used to implement a reduced leakage device.

After the gate and gate dielectric are fully formed, the finished transistor is further processed to add contacts, electrodes, isolation layers, inter-layer dielectrics, wiring paths and any other layers as desired. While only one fin and one transistor are shown for simplicity, typically, the described operations are performed on a silicon wafer using a plasma chamber so that thousands or millions of transistors may be formed at the same time. The described stages may be used only for high power transistors or for some or all of the FinFET transistors. After the additional processes and layers are completed, then the wafer may be diced and each die may be further processed and packaged.

Figure 12:
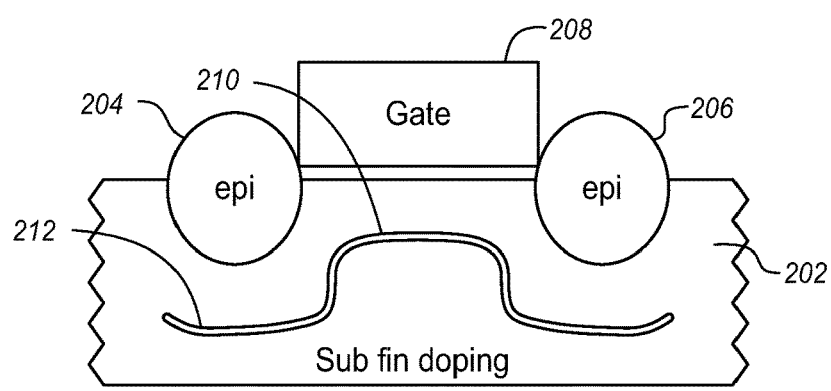
FIG. 12 is a cross-sectional side view diagram of the structure of FIGS. 9 and 10 taken along a line along the fin according to an embodiment.

FIG. 12 is a cross-sectional side view diagram of the FinFET transistor of FIGS. 9 and 10 taken along the length of fin and through the fin or longitudinal with the fin. The cross-section is perpendicular to the lines A-A and B-B of FIG. 1. In this diagram the illustrated portion of the fin 202 has a central metal gate 208 with an epitaxial source 204 source on one side and an epitaxial drain 206 on the other side of the gate.

A curve within the fin shows that the glass level under the fin is at one level 210 under the gate and at a second lower level 212 under the epitaxial source and drain. The two glass heights, the lower height shown in FIG. 5 and the higher height in FIG. 6 result, after thermal anneal, result in a curved doping profile. Because the doped glass is recessed further in the source and drain regions, the sub-fin doping is pushed further away from the epitaxial layers during the thermal anneal.

Figure 13:
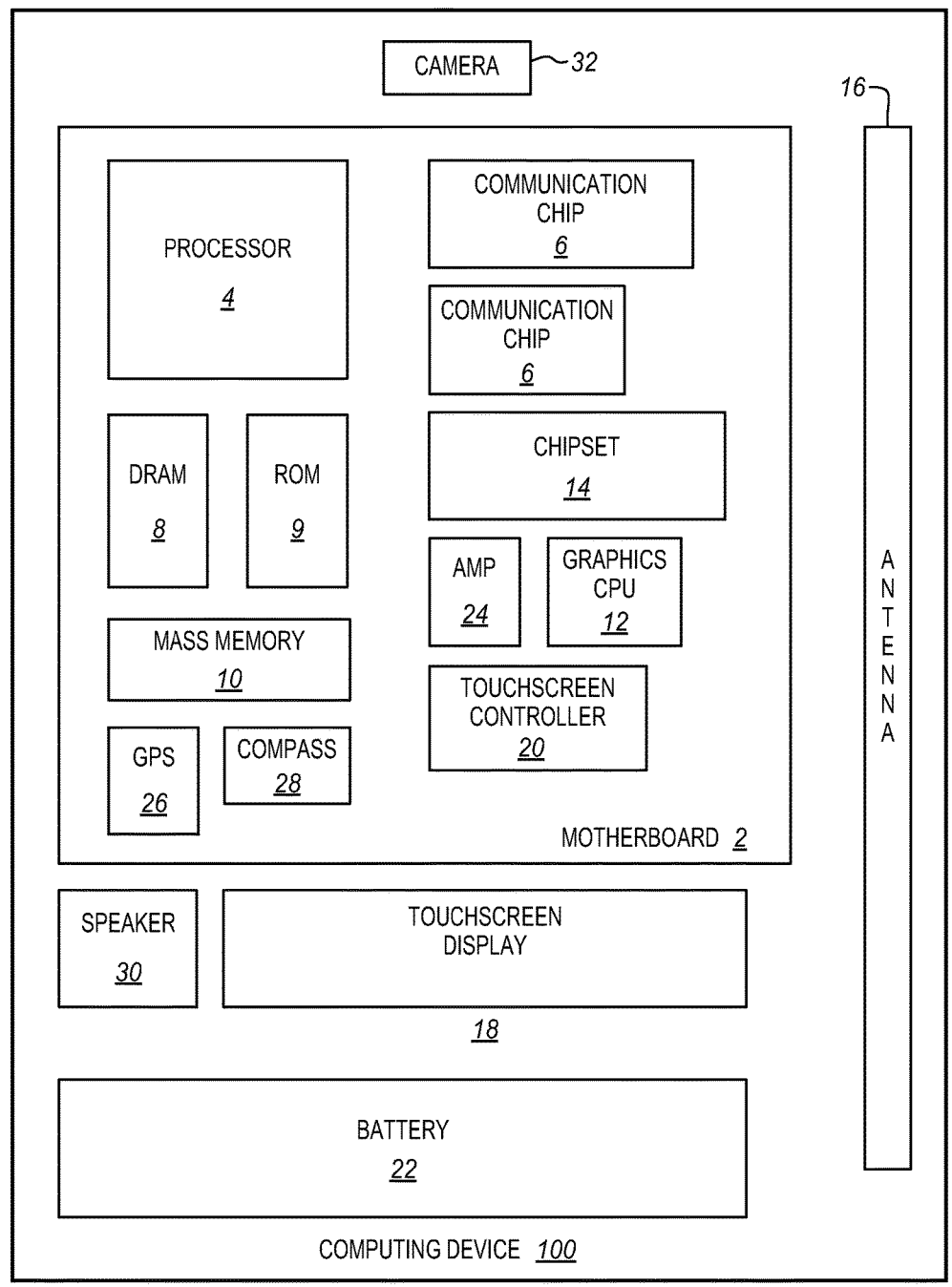
FIG. 13 is a block diagram of a computing device incorporating a tested semiconductor die according to an embodiment.

FIG. 13 illustrates a computing device 11 in accordance with one implementation. The computing device 11 houses a board 2. The board 2 may include a number of components, including but not limited to a processor 4 and at least one communication chip 6. The processor 4 is physically and electrically coupled to the board 2. In some implementations the at least one communication chip 6 is also physically and electrically coupled to the board 2. In further implementations, the communication chip 6 is part of the processor 4.

Depending on its applications, computing device 11 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touch screen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication chip 6 enables wireless and/or wired communications for the transfer of data to and from the computing device 11. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 11 may include a plurality of communication chips 6. For instance, a first communication chip 6 may be dedicated to shorter range wireless communications such as Wi-Fi and Bluetooth and a second communication chip 6 may be dedicated to longer range wireless communications such as GPS, EDGE, GPRS, CDMA, WiMAX, LTE, Ev-DO, and others.

The different components shown may include FinFET transistor fabricated and structured as described herein. The wireless communication and power devices may contain higher power transistors for which current leakage is more significant. These may benefit in particular from the dual height glass techniques and structures as described herein. The term "processor" may refer to any device or portion of a device that processes electronic data from registers and/or memory to transform that electronic data into other electronic data that may be stored in registers and/or memory.

In various implementations, the computing device 11 may be a laptop, a netbook, a notebook, an ultrabook, as smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 11 may be any other electronic device that processes data including a wearable device.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a method that includes applying a glass layer over a fin of a FinFET structure, the fin having a source region and a gate region, applying a polysilicon layer over the gate region, removing a portion of the glass layer from the source region after applying the polysilicon, thermally annealing the glass to drive dopants into the fin, and applying an epitaxial layer over the source region.

In further embodiments applying a glass layer comprises applying a doped glass layer.

In further embodiments applying a glass layer comprises applying a boron doped glass layer over the source and the drain region and applying a phosphorous doped glass layer over the gate region.

Further embodiments include applying an isolation layer over the glass layer before applying the polysilicon.

In further embodiments removing a portion of the glass layer comprises masking over areas other than the source region and then etching the glass layer.

In further embodiments etching comprises exposing the source region to a radio frequency plasma.

Further embodiments include forming a dielectric spacer over the source region after thermally annealing the glass and before applying the epitaxial layer.

In further embodiments the spacer is a shallow trench isolation.

Further embodiments include removing a second portion of the glass and isolation layers from the fin before applying the polysilicon gate.

Further embodiments include removing the polysilicon and replacing the polysilicon with dielectric and gate materials to form a gate.

In further embodiments the FinFET structure is a transistor, the fin further having a drain region and wherein applying a glass layer, removing the glass layer and applying an epitaxial layer are also performed on the drain region.

Some embodiments pertain to a semiconductor structure that includes a fin formed over a semiconductor substrate to carry a FinFET structure, a doped source region on the fin, a doped gate region on the fin, a first doped glass layer over the source region having a first height above the semiconductor structure on the fin, a second doped glass layer over the gate region having a second height above the semiconductor structure on the fin, the second height being higher than the first height, and a gate over the gate region and the glass layer.

In further embodiments the first doped glass layer is doped with phosphorous.

In further embodiments the second doped glass layer is doped with boron.

Further embodiments include a dielectric shallow trench isolation over the source region and over the glass layer on the fin.

In further embodiments the first doped glass layer has half the height above the semiconductor layer of the second doped glass layer.

Further embodiments include a doped drain region on the fin on side of the gate region opposite the source region so that the gate region is between the drain region and the source region, and a third doped glass layer over the drain region having the first height above the semiconductor structure on the fin.

Some embodiments pertain to a computer system that includes a system board, a memory coupled to the board, and a processor coupled to the board and to the memory through the board, the processor having a plurality of transistors, at least a portion of the transistors being based on a FinFET structure, the structure has a fin formed over a semiconductor substrate to carry a FinFET structure, a doped source region on the fin, a doped drain region on the fin, a doped gate region on the fin between the source region and the drain region, a first doped glass layer over the source region having a first height above the semiconductor structure on the fin, a second doped glass layer over the gate region having a second height above the semiconductor structure on the fin, the second height being higher than the first height, a third doped glass layer over the drain region having the first height above the semiconductor structure on the fin, and a gate over the gate region and the glass layer.

Further embodiments include an isolation layer over the first, second, and third glass layers, the isolation layer having a height essentially the same as the corresponding glass layer.

Further embodiments include a shallow trench isolation layer over the first and third doped glass regions.

The invention claimed is:

1. A semiconductor structure comprising:
   a fin formed over a semiconductor substrate to carry a FinFET structure;
   a doped source region of the fin;
   a doped gate region of the fin;
   a first doped glass layer over the source region of the fin, the first doped glass layer having a first height above the semiconductor substrate;
   a second doped glass layer over the gate region of the fin, the second doped glass layer having a second height above the semiconductor substrate, the second height being higher than the first height; and
   a gate over the gate region and the second doped glass layer.

2. The structure of claim 1, wherein the first doped glass layer is doped with phosphorous.

3. The structure of claim 1, wherein the second doped glass layer is doped with boron.

4. The structure of claim 1, further comprising a dielectric shallow trench isolation over the source region and over the first doped glass layer and over the second doped glass layer.

5. The structure of claim 1, wherein the first doped glass layer has half the height above the semiconductor layer of the second doped glass layer.

6. The structure of claim 1, further comprising:
   a doped drain region of the fin on side of the gate region opposite the source region so that the gate region is between the drain region and the source region; and
   a third doped glass layer over the drain region, the third doped glass layer having the first height above the semiconductor substrate.

7. A computer system comprising:
   a system board;
   a memory coupled to the board; and
   a processor coupled to the board and to the memory through the board, the processor having a plurality of transistors, at least a portion of the transistors being based on a FinFET structure, the structure comprising
   a fin formed over a semiconductor substrate to carry a FinFET structure;
   a doped source region of the fin;
   a doped drain region of the fin;
   a doped gate region of the fin between the source region and the drain region;
   a first doped glass layer over the source region of the fin, the first doped glass layer having a first height above the semiconductor substrate;
   a second doped glass layer over the gate region of the fin, the second doped glass layer having a second height above the semiconductor substrate, the second height being higher than the first height;
   a third doped glass layer over the drain region, the third doped glass layer having the first height above the semiconductor substrate; and
   a gate over the gate region and the second doped glass layer.

8. The computer system of claim 7, the structure further comprising an isolation layer over the first, second, and third glass layers, the isolation layer having a height essentially the same as the corresponding glass layer.

9. The computer of claim 7, the structure further comprising a shallow trench isolation layer over the first and third doped glass regions.

* * * * *